United States Patent [19]

Ankri et al.

[11] Patent Number: 4,801,993

[45] Date of Patent: Jan. 31, 1989

[54] MONOLITHIC SEMICONDUCTOR STRUCTURE OF A HETEROJUNCTION BIPOLAR TRANSISTOR AND A LASER

[76] Inventors: David Ankri, 1 allée des Bouvreuils, 91370 Verrieres; Jean-François Palmier, 9 rue Léon Bloy, 92260 Fontenay-aux-Roses, both of France

[21] Appl. No.: 10,733

[22] Filed: Feb. 4, 1987

[30] Foreign Application Priority Data

Feb. 4, 1986 [FR] France .................. 86 01508

[51] Int. Cl.[4] ........................................... H01L 27/02
[52] U.S. Cl. ........................................ 357/40; 357/34; 357/19; 357/16; 357/4; 357/17; 357/55; 357/43
[58] Field of Search .................. 357/34, 17, 16, 40, 357/43, 46, 4, 55, 19

[56] References Cited

U.S. PATENT DOCUMENTS 3,982,207 9/1976 Dingle et al. .................. 357/4 X

FOREIGN PATENT DOCUMENTS 0129477 12/1984 European Pat. Off. .
0166593 1/1986 European Pat. Off. .
3605130 8/1986 Fed. Rep. of Germany .
58-142574 8/1983 Japan .

OTHER PUBLICATIONS

"A Monolithic Integration of GaAs/GaAlAs Biblar Transistor and Heterostructure Laser", Katz et al., *Appl. Physics Letters*, 15 Jul. 80, vol. 37, No. 2, pp. 211–213.

"Fujitsu Refines Method For Semiconductor Lasers", *J.E.E. Journal of Electronic Engineering*, Sep. 84, vol. 21, No. 213, p. 21.

Bar–Chaim et al., "GaAs Integrated Optoelectronics", *IEEE Transactions On Electron Devices*, Sep. 1982, vol. ED-29, No. 9, pp. 1372–1381.

Cheney et al., "BIGFET Makes IGFET More Versatile", *Bell Lab. Record*, Jun./Jul. 1972, vol. 50, No. 6, pp. 194–198.

*Primary Examiner*—Andrew J. James
*Assistant Examiner*—William A. Mintel
*Attorney, Agent, or Firm*—Oblon, Fisher, Spivak, McClelland & Maier

[57] ABSTRACT

This structure comprises a heterostructure formed from first, second and third stacked semiconductor layer, the first and third layers being of N-GaAlAs having a forbidden band width at least equal to that of the materials forming the second layer constituting the active layer of the structure, said second layer being formed from a super-lattice having thin layers of P-GaAs and thin layers of P-GaAlAs in alternating form and oriented parallel to the first and third layers, a N region extending at least from one face to the other of the third layer defining with the latter the PN junction of the laser and means for supplying the laser and transistor with current.

10 Claims, 2 Drawing Sheets

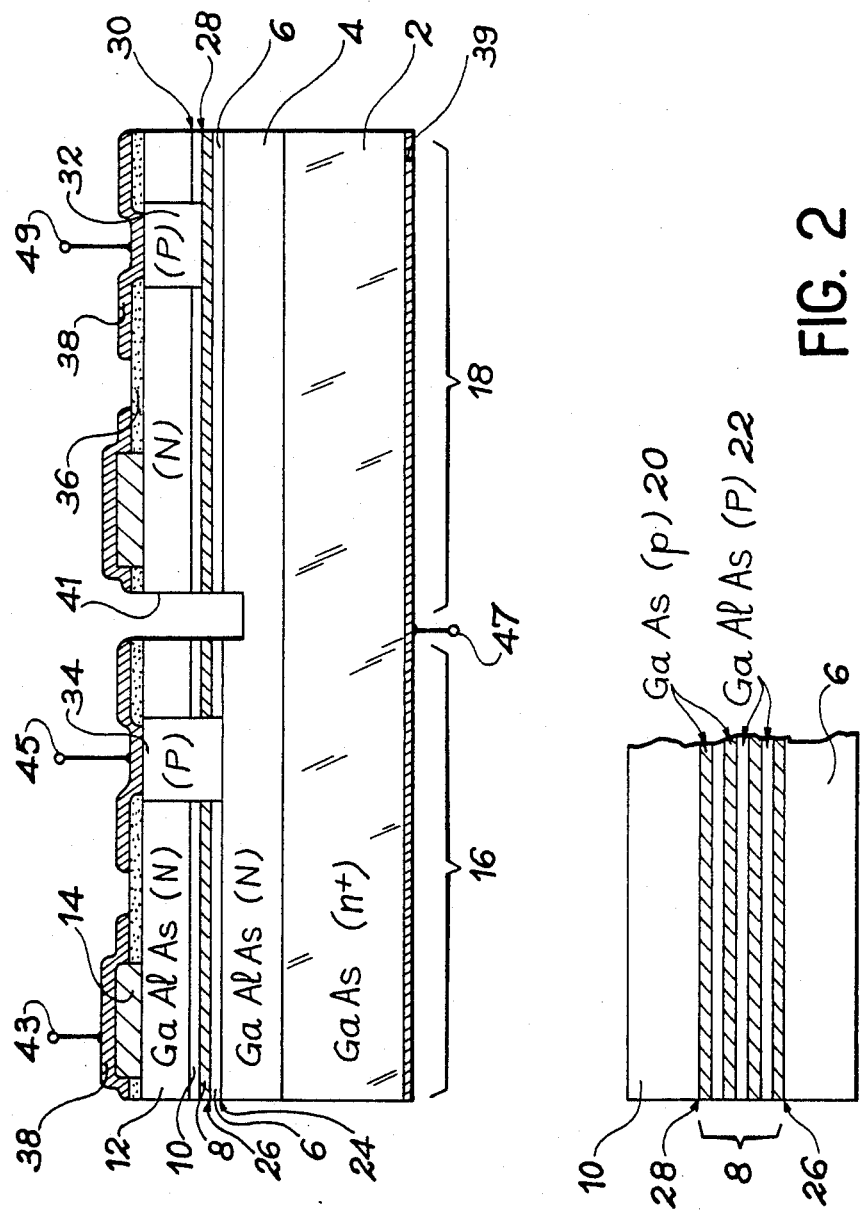

MONOLITHIC SEMICONDUCTOR STRUCTURE OF A HETEROJUNCTION BIPOLAR TRANSISTOR AND A LASER

BACKGROUND OF THE INVENTION

The present invention relates to a planar monolithic semiconductor structure of a bipolar heterojunction transistor and a laser. This transistor forms part of the control or modulation circuit of the laser. The invention mainly applies to the field of telemetry, integrated optics or optical fibre telecommunications.

More specifically, the invention relates to a planar, bipolar, integrated heterojunction transistor—laser structure produced on a semiconductor substrate of III-V material.

As a known integration solution for a heterojunction bipolar transistor and a laser source, reference can be made to the article in Appl. Phys. Lett, 37(2) of July 15, 1980, pp 211–213 and entitled "A monolithic integration of GaAs/GaAlAs bipolar transistor and heterostructure laser" by J. KATS et al. In this integration solution, the laser and bipolar transistor are juxtaposed on the same GaAs semiconductor substrate on which are epitaxied the different semiconductor layer in which are defined the junctions of the laser and the transistor. In this monolithic structure, the laser has a relatively high threshold current and therefore a high energy dissipation, together with a low differential efficiency, so that a high modulation current is required.

As another solution for the integration of a laser and a transistor, reference can be made to the article in Appl. Phys. Lett, 46(3) February 1985, pp 226–228 entitled "Monolithic integration of Low Threshold current quantum well laser and a driver circuit on a GaAs substrate" by T. SANDA et al. In this solution, the transistor used is a field effect transistor. In addition, the laser is of the type having a vertical injection of the electrons and the active layer of the laser is provided with a GRINSCH.

The advantages of such a laser structure are in particular low threshold current and consequently a low energy dissipation, so that only a low modulation current is required. moreover, the corresponding field effect transistor—laser structure has a limited thermal sensitivity and can operate at high temperatures.

Thus, this integrated field effect transistor—laser structure has performance characteristics very close to those of discrete components. However, for producing a short gate transistor and therefore a high transconductance transistor, it is necessary to form the laser at the bottom of a hole. This technology is relatively complicated and in particular causes problems with respect to the production of resin masks by photolithography and which are used for defining the dimensions of the transistor gate. It is difficult to reproduce this technology. Furthermore, for increasing the reliability of transistor production, the semiconductor layers of this component must be produced following the epitaxy of the laser conductor layers during a supplementary operation. The laser performance characteristics may be impaired by said repeated ionic epitaxy operations.

SUMMARY OF THE INVENTION

The present invention relates to a monolithic semiconductor structure of a heterojunction bipolar transistor and a laser making it possible to obviate the aforementioned disadvantages. In particular, it makes it possible to bring about a true integration of the laser and a transistor according to an entirely planar structure on the basis of a single epitaxy of the semiconductor substrate. Moreover, the laser has a low threshold current and a high differential efficiency.

More specifically, the present invention relates to a monolithic semiconductor structure of a bipolar heterojunction transistor and a laser, wherein it comprises a heterostructure having first, second and third semiconductor layers superimposed in this order, the first and third layers being produced from materials having a first type of conductivity with forbidden band widths at least equal to those of the second layer, whereby the latter, which constitutes the active layer of the laser and the base of the transistor has a second conductivity type differing from the first type and being formed from several materials having different forbidden band widths, defining at least one confinement zone of the carriers solely for the laser, oriented parallel to the first and third layers; a first region extending at least from one face to the other of the third layer and having the second conductivity type, said first region defining with the third layer the junction of the laser; and means for supplying current to the laser and the transistor.

Throughout the remainder of the specification, the second semiconductor layer of the structure forming the active layer of the laser and the base of the transistor will be called the active layer of the structure.

Apart from the advantages referred to hereinbefore, the monolithic structure according to the invention is relatively simple and causes no particular production problems. Moreover, it has a low thermal sensitivity.

Contrary to what would have been expected, the inventors have found that the integration of a laser source and a bipolar transistor, using as the active layer for the laser and the transistor a heterostructure defining at least one confinement zone of the carriers satisfying certain conditions was compatible.

It is known that the confinement of the carriers in the active zone of the laser is beneficial for increasing the number recombinations between the electrons and the holes and therefore the emission of light. However, in a transistor the presence of a confinement zone is prejudicial to the passage of electrons and is therefore prejudicial to the operation of the transistor and may even render it inoperative.

The carrier confinement zone can be realised either in the form of a GRINSCH or in the form of a super-lattice. As the latter is easier to obtain, preferably the second semiconductor layer in active layer of the structure is produced in this form. According to the invention, the super-lattice is formed from a first series of parallel thin layers having an identical thickness and produced from a first material, and a second series of parallel thin layers having an identical thickness and made from a second material having a band width greater than that of the first material, the first and second series alternating.

In order to ensure good contacting with the transistor base, the semiconductor structure according to the invention is advantageously provided with a second region extending at least from one fact to the other of the third layer having the second conductivity type.

Advantageously, the semiconductor structure according to the invention comprises a fourth semiconductor layer, inserted between the second and third layers, and whose composition varies gradually in order to have at the interface between the fourth and third layers the composition of the third layer and at the interface between the fourth and second layers the surface composition of the second layer.

In the same way, the structure according to the invention can comprise a fifth semiconductor layer, which is inserted between the second and first layers and whose composition varies gradually to have at the interface between the fifth and second layers the surface composition of the second layer and at the interface between the fifth and first layers the composition of the first layer.

These gradual composition layers make it possible to increase the mobility of the electrons in the bipolar transistor from the emitter towards the base and the collector as compared with an abrupt structure (direct passage from a material with a limited forbidden band width to a material with a large forbidden band width and vice versa).

The semiconductor structure according to the invention is more particularly produced on a monocrystalline semiconductor substrate made from a III-V material and which can be InP, GaAs, GaSb, InAs, or InSb. These III-V materials correspond to materials having a limited forbidden band width. As a function of the substrate used, the material having a high forbidden band width will be GaInAs, GaInAsP, AlInAs, GaAlInAs or GaAlAs.

Preferably, the structure according the invention is produced on a GaAs substrate, the first layer being of N type $Ga_{1-x}Al_xAs$ with $0 \leq x \leq 1$, the third layer being made from N type $Ga_{1-t}Al_tAs$ with $0 \leq t \leq 1$, the first material being of p type GaAS and the second material of P type $Ga_{1-y}Al_yAs$ with $0 \leq y \leq 1$. In particular, y varies between 0 and 0.45.

With such a structure, a laser source is obtained emitting in particular at a wavelength of 0.85 μm. Thus, this structure can advantageously be used in the field of short distance telecommunications.

The inventors have found that the compatibility between the laser and the bipolar transistor was linked with the thickness of the second material having the highest forbidden band width. Advantageously the thickness of these layers is such that the factor $b \sqrt{w}$ varies between 1.2 and 1.9 nm $\sqrt{w}$, b being the thickness of these layers and w the difference in the conduction energies between the first and second materials. These values are given for information purposes in the case of a value of y such that $0 \leq Y \leq 0.45$.

In order to increase to the mobility of the electrons in the transistor whilst lowering the resistance of the base, the second material having the highest band width advantageously contains a larger number of dopants of the second type and in particular of the p type than the first material with the smaller forbidden band width. However, it is quite possible to use the same doping for the first and second materials.

The semiconductor structure according to the invention can be produced in a simple manner by epitaxying the different semiconductor layers forming the same on a III-V material substrate.

Moreover, in order to minimise the contact resistance between the third semiconductor layer and the electrodes for supplying current to the transistor and the layer, the semiconductor structure advantageously has on said third layer a sixth semiconductor layer made from a material having a forbidden band width below that of the third semiconductor layer.

The first and third semiconductor layers of the structure according to the invention can independently serve as the transistor emitter or collector when their composition is relatively close. However, by convention, the first semiconductor layer generally constitutes the collector and the third semiconductor layer the emitter. This convention will be used throughout the remainder of the description.

BRIEF DESCRIPTION OF THE DRAWINGS

The invention is described in greater detail hereinafter relative to non-limitative embodiments and the attached drawings, wherein show:

FIG. 1, in longitudinal section the semiconductor structure according the invention.

FIG. 2, diagrammatically a first embodiment of the active layer of the semiconductor structure according to the invention.

DETAILED DESCRIPTION OF THE PREFERRED EMBODIMENTS

Figure 3:
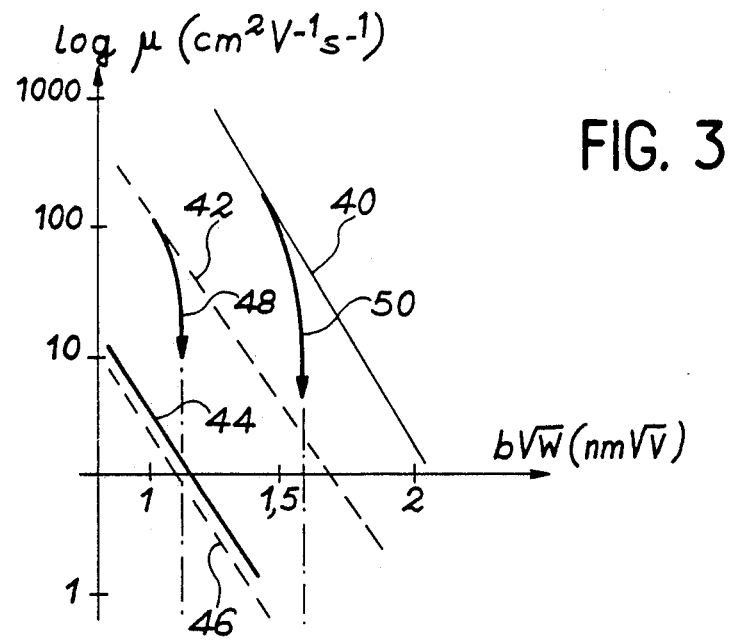
FIG. 3, a diagram giving the logarithm of the mobility of the carriers as a function of the thickness of the high forbidden band matereial and the conduction energy difference between the first and second materials constituting the super-lattice.

The following description refers to a GaAs/GaAlAs semiconductor structure. The GaAs corresponds to the small forbidden band width material and the GaAlAs to the large forbidden band width material.

FIG. 1 shows on longitudinal section the semiconductor structure according to the invention. This transistor—laser structure comprises a type $n^+$, GaAs semiconductor substrate 2. The type $n^+$ doping is obtained with silicon ions at a concentration of $10^{17}$ atoms/cm$^3$. On said substrate 2 are deposited by chemical vapour phase epitaxy on the basis on organic compounds (MOCVD) or molecular beam epitaxy (NBE), in superimposed manner six semiconductor layers which, starting from substrate 2, carry the reference numerals 4, 6, 8, 10, 12 and 14.

Layer 4 is of N type $Ga_{1-x}Al_xAs$ with $0 \leq x \leq 1$. This layer can have a thickness of approximately 3 μm and is made from $Ga_{0.6}Al_{0.4}As$ or GaAs. The N doping is obtained with silicon ions at a concentration of $5.10^{17}$ atoms/cm$^3$. This layer 4 constitutes the collector of transistor 16 and a confinement layer of the electrons and holes for laser 18.

Layer 8, which forms the base of transistor 16 and the active layer of laser 18, has a super-lattice structure, as shown in FIG. 2. Layer 8 is formed from a stack of two alternating series of different layers, namely type p GaAs layers 20 and type P $Ga_{1-x}Al_yAs$ layers 22 with $0 \leq y \leq 1$. Preferably, y satisfies the relation $0 \leq y \leq 0.45$ and in particular y is 0.24. Layers 20 and 22 form a periodic structure, each layer 20 being inserted between two layers 22 and vice versa.

This stack of layers or super-lattice constitutes a plurality of quantum wells (MQW), the wells corresponding to GaAs and the barriers to $Ga_{1-y}Al_yAs$. It makes it possible to obtain a laser source 18 with a low threshold current leading to the use of a lower current for modulating the laser.

In order to increase the displacement speed of the electrons for transistor 16, the layers 22 having the greatest forbidden band width can be more highly doped with p ions than layers 20. In particular, layers 22 can be doped with beryllium at a concentration of $10^{19}$ atoms/cm$^3$ and layers 20 can be doped with beryllium at a concentration of $10^{18}$ atoms/cm$^3$. This makes it possible to obtain a relatively small basic resistance of the transistor and in particular equal to or below 1000 ohms.

In the particular example of y between 0.21 and 0.3, layers 22 have a thickness between 2.5 and 3.5 nm and in particular 3.2 to 3.5 nm. Layers 20 have a thickness between 3 and 10 nm and e.g. equal to 4.5 nm. the influence of the thickness of layers 20 and 22 on the operation of the structure will be described in greater detail relative to FIG. 3.

The number of layers 20 and 22 constituting the active layer 8 of the structure is preferably such that the thickness of the active layer is a multiple of 0.25 nm, said figure corresponding to a half-mesh of the crystalline structure of GaAs. Active layer 8 e.g. has a thickness of 0.25 μm.

The semiconductor layer 12 in which are formed the emitter of transistor 16 and the PN junction of laser 18 is of N type $Ga_{1-t}Al_tAs$ with $0 \leq t \leq 1$. In particular, layer 12 can be of $Ga_{0.72}Al_{0.28}As$ and have a thickness of 1 μm. The N doping is obtained with silicon ions having a concentration of $5.10^{17}$ atoms/cm$^3$.

The aluminum content of layers 4, 12 and 22 can of be of random nature, provided that the forbidden band width of layers 4 and 12 is at least equal to that of layers 22 so that transistor 16 functions correctly. The semiconductor layer 6 inserted between semiconductor layers 4 and 8 has a gradually varying composition.

At the interface 24 of layers 4 and 6, the composition of layer 6 is the same as that of layer 4 and has in particular the composition $Ga_{0.6}Al_{0.4}As$. At the interface 26 between layers 6 and 8, layer 6 has a composition which is the same as that of the first layer forming the super-lattice and is in particular of GaAs.

As for the composition, the doping of layer 6 varies in a gradual manner. In particular, at interface 24, layer 6 can be doped with silicon ions (n type) at a concentration below $5.10^{16}$ and at the interface 16 with silicon ions at a concentration of $2.10^{17}$ atoms/cm$^3$. Layer 6 has a thickness of approximately 30 nm.

In the same way, semiconductor layer 10 placed between the active layer and the semiconductor layer 12 has a gradually varying composition, so that at the interface 28 between layers 8 and 10 it has a composition which is the same as that of the final layer of the lattice and in particular a GaAs-type composition (cf FIG. 2) and so as to have at the interface 30 between layers 10 and 12 a composition which is the same as that of layer 12 and in particular a composition of type $Ga_{0.72}Al_{0.28}As$.

The doping varies in the same way as the composition of said layer. The concentration of silicon ions at interface 28 is below that at interface 30. At interface 28, the concentration is e.g. equal to $5.10^{16}$ atoms/cm$^3$ and at interface 30 is equal to $2.10^{17}$ atoms/cm$^3$. Layer 10 has a thickness of 30 nm.

On contact with layer 12, the semiconductor 14 has a composition such that its forbidden band width is below that of layer 12. In particular, layer 14 can be of GaAs and can have n type doping. Semiconductor layer 14 is used as the contactor for the emitter of transistor 16 and can have a thickness of 0.2 μm.

The structure shown in FIG. 2 comprises two P type implanted regions 32 and 34 respectively used for forming the PN junction of layer 18 and for constituting the contactor on the base of transistor 16. For example, these two regions are obtained by implanting beryllium ions at a dose of $3.10^{15}$ atoms/cm$^2$ and then carrying out thermal annealing at 800° C.

Advantageously, implanted zone 34 serving as a contactor on the transistor base traverses layers 12, 10, 8 and 6. However, the implanted layer 32 forming the PN junction of the layer only traverses layers 12 and 10.

The complete structure is provided with an insulating layer 36, e.g. of silicon oxide etched in an appropriate manner to permit contacting with the emitter and the base of transistor 16 on the one hand and the N region and P region of the laser on the other. This silicon oxide layer 36 is covered with an aluminium layer 38 in which are defined the electrodes of the emitter and the base of the transistor and the electrode of the P region of the laser.

Moreover, the structure is provided with an electrode 39 covering the lower part of the structure and used for electrically connecting the N junction of laser 18 to the collector of transistor 16.

Finally, a window 41 is formed, which passes through layers 38, 36, 12, 10, 8 and 6, in order to electrically insulate transistor 16 and laser 18.

Figure 4:
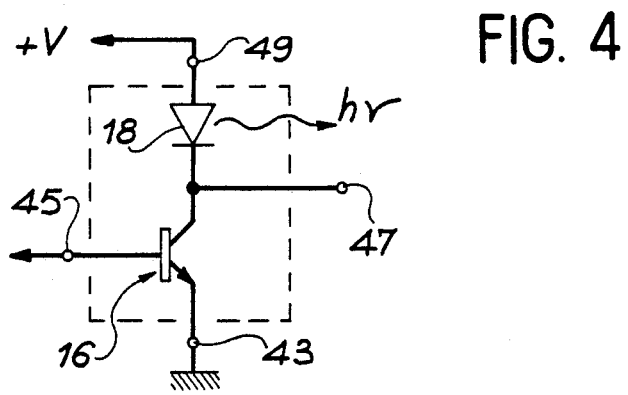
FIG. 4, an electric diagram corresponding to the structure shown in FIG. 1.

FIG. 4 diagrammatically shows the equivalent electric circuit of the structure shown in FIG. 1. References 43, 45 and 47 respectively correspond to the terminals of the emitter, the base and the collector of the transistor, whilst reference 49 designates the terminal of the P junction of the laser. The structure operates by applying a potential $+V$ to terminal 49 and by connecting the emitter to ground.

The interest of the heterojunction bipolar transistor described hereinbefore is due to its considerable sorting dynamics between the carriers, i.e. between the electrons and the holes. Thus, the energy barrier which the minority carriers, in this case the holes, have to overcome to pass from the base into the emitter means that the gain of such a structure is very high. Thus, the gain of such a structure is given by the ratio $I_c/I_b$, in which $I_c$ represents the current flowing in the collector and $I_b$ the current flowing in the base.

In the structure according to the invention, the laser holes and electrons move perpendicular to the layers. The transistor holes move parallel to the layers and the transistor electrons perpendicular to the layers.

FIG. 3 shows the logarithm of the mobility μ of the carriers in the super-lattice structure in a direction perpendicular to the plains of the layers, as a function of a parameter $b\sqrt{w}$, in which b is the width of the barrier of the super-lattice, i.e. the thickness of the layers 22 having the highest forbidden band width and w the difference in the conduction energies between the wells and the barrier, which is a barrier potential energy, the well corresponding to the layers 20 of the super-lattice having the smallest forbidden band width. The value of w is directly proportional to the aluminum concentration of the semiconductor material. In the case shown, the aluminum concentration y satisfies the relation $0 \leq y \leq 0.45$. The logarithm of the mobility of the carriers is expressed in cm$^2$ V-1S-1 and corresponds to the displacement speed of the carriers.

In the diagram, the straight line 40 represents the ideal conduction of the electrons by Bloch state or Bloch waves. Curve 40 corresponds to a periodic lattice structure in which the materials of the wells and the barriers are pure. In the same way, the dotted line 42 corresponds to the conduction of Bloch state of the holes for an ideal material.

Curve 44 corresponds to a conduction by quantum jumps of the electrons (passage of an electron from a well to a barrier, i.e. from layer 20 to layer 22), whilst the broken line 46 corresponds to a conduction by quantum jumps of the holes. The conductions symbolized by curves 44 and 46 are obtained by a super-lattice produced without any special precautions.

The theoretical determination of curves 40 to 46 has been dealt with in numerous publications, in particular the article IBM Jal Res and Dec. 14, 1970, p 61 ff by L. ESAKI and R. TSU and the article JAL de Physique 43, 1982, p 381 ff by J. F. PALMIER and A. CHOMETTE.

Finally, curves 48 and 50 correspond to the logarithm of the mobility of the carriers as a function of the parameter $b\sqrt{w}$, in a direction perpendicular to the layers.

As the effective mass of the holes is much greater than that of the electrons, the passage from band conduction (curves 40 and 42) to jump conduction (curves 44 and 46) does not take place at the same values of parameter $b\sqrt{w}$ for the holes and the electrons.

The use of a super-lattice, whose parameter $b\sqrt{W}$ varies from 1.2 to 1.9 nm by $\sqrt{W}$, with $0 \leq y \leq 0.45$ makes it possible to reinforce the barrier height for the holes (slow carriers), but allows for the electrons to pass (fast carriers). This makes it possible to obtain a sufficiently high gain for the transistor.

The inventors have produced structures of the aforementioned type, in which layers 4 and 8 were respectively made from GaAs $Si_{17}$ doped at $5.10^{16}$ and $Ga_{0.72}Al_{0.28}As$ Si doped at $5.10^{17}$. The layers 22 were made from $Ga_{0.76}Al_{0.24}As$, which were beryllium doped at $3.10^{16}/cm^2$ and layers 20 were made from GaAs which was not intentionally doped. The thickness of layer 22 was 2.25 nm in a first example and 4.5 nm in a second example, whilst the thickness of layers 20 was 4.5 nm in both examples. In the first example, the transistor obtained had a gain exceeding 500, whilst in the second case the gain was to 1.

Moreover, research was carried out on a laser having a super-lattice in the active layer. This research revealed that the greatest efficiency of the laser, i.e. the largest number of recombinations between the electrons and the holes was obtained for barrier thicknesses between 3.2 and 3.5 nm, when the aluminum concentration of the barrier layers 22 as between 0.2 and 0.3.

Taking account of what was stated hereinbefore, the inventors found that barriers having a composition y between 0.2 and 0.3, with a thickness between 3.2 and 3.5 nm and in particular equal to 3 nm made it possible in this specific case to render compatible a laser and a heterojunction bipolar transistor by using a super-lattice structure for forming the active layer of the laser and the base of the transistor.

It is possible to replace the super-lattice structure of layer 8 forming the base of the transistor and the active layer of the laser by a GRINSCH.

Figure 5:
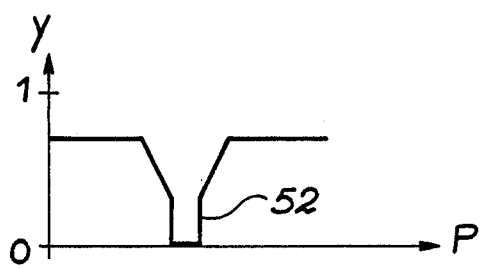
FIG. 5, a second embodiment of the active layer of the structure according to the invention, constituting a diagram giving the aluminum composition y of said layer as a function of the depth of the layer.

FIG. 5 shows the variations of the composition y of a $Ga_{1-y}Al_yAs$ layer constituting the active layer 8, as a function of the depth of this layer. Like the super-lattice, the GRINSCH defines a confinement zone 52 of the holes and electrons in the laser and consequently ensures a high recombination of these carriers and a blocking of the holes for the bipolar transistor and therefore ensures a high gain of the transistor.

The thicknesses of the barriers given hereinbefore clearly correspond to a structure of the GaAs GaAlAs type with a particular composition y. The determination of the thickness of the barriers for other structures can be giving the logarithm of the mobility of the carriers as a function of the parameter $b\sqrt{w}$.

The above description has been given in a non-limitative manner and modifications are possible thereto without passing beyond the scope of the invention.

In particular, the thickness, doping and composition of the different semiconductor layers of the bipolar transistor—laser structure can be modified, provided that there is adherence to the specific conditions linked with the forbidden band widths of the different materials forming the different layers of the structure.

Moreover, it is possible to achieve an equivalent structure with a pnp transistor and an implanted n region for the laser. It is then merely necessary to replace all the silicon dopings by beryllium doping and vice versa.

What is claimed is:

1. A monolithic semiconductor structure forming both a bipolar heterojunction transistor and a laser structure, comprising a heterostructure having a first, second and third semiconductor superimposed layers, the first and third layers constituting respectively the collector and the emitter of the transistor and being produced from a first and second III-V materials having a first type of conductivity and the second layer, which is placed between the first and third layers and constitutes the active layer of the laser structure and the base of the transistor, having a second conductivity type differing from the first type and being a super-lattice consisting of first series of GaAs parallel layers having an identical thickness and of a second series of parallel $Ga_{1-y}Al_yAs$ layers with $0<y<1$ having an identical thickness b satisfying the relation $1.2<b\sqrt{w}<1.9$, in which w represents the difference of the conduction energies between GaAs and $Ga_{1-y}Al_yAs$, the layers of said first and second series alternating, the forbidden band widths of said first and second materials being at least equal to the one of $Ga_{1-y}Al_yAs$ layers of said super-lattice which defines confinement zones of the carriers solely for the laser structure, oriented parallel to the first and third layers; a first region extending at least from one face to the other of the third layer and having the second conductivity type, said firsr region defining with the third layer the junction of the laser; and means for supplying current to the laser and the transistor.

2. A semiconductor structure according to claim 1, wherein a second region extending at least from one face to the other of the third layer and having the second conductivity type is provided, said second region serving as an electric contact for the base of the transistor.

3. A semiconductor structure according to claim 1, wherein a fourth semiconductor layer is provided between the second and third layers and whose composition varies gradually, so that at the interface between the fourth and third layers it has the composition of the third layer and at the interface between the fourth and second layers the surface composition of the second layer.

4. A semiconductor structure according to claim 1, wherein a fifth semiconductor layer is inserted between the second and first layers and whose composition varies gradually, so that at the interface between the fifth and second layers it has the surface composition of the second layer and at the interface between the fifth and first layers the surface composition of the first layer.

5. A semiconductor structure according to claim 1, wherein the first layer is made of a type N $Ga_{1-x}Al_xAs$ with $0 \leq x \leq 1$, the third layer being made from type N $Ga_{1-t}Al_tAs$ with $0 \leq t \leq 1$, and the second material being of P type.

6. A semiconductor structure according to claim 1, wherein y satisfies the relation $0 \leq y \leq 0.45$.

7. A semiconductor structure according to claim 1, wherein the second material contains a number of dopants of the second type larger than the first material.

8. A semiconductor structure according to claim 4, wherein the second region extends from the upper surface of the third layer to the lower surface of the fifth layer.

9. A semiconductor structure according to claim 3 wherein the first region extends from the upper surface of the third layer to the lower surface of the fourth layer.

10. A semiconductor structure according to claim 1, wherein a semiconductor substrate on which are epitaxied the semiconductor layers and a sixth semiconductor layer in contact with the third layer serving as an electric contact are provided, said sixth layer being produced from a material having a forbidden band width below that of the third material.

* * * * *